United States Patent
Xiong

(10) Patent No.: US 8,525,542 B2
(45) Date of Patent: Sep. 3, 2013

(54) SHORT CIRCUIT DETECTION DEVICE

(75) Inventor: Jin-Liang Xiong, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 358 days.

(21) Appl. No.: 12/908,069

(22) Filed: Oct. 20, 2010

(65) Prior Publication Data

US 2011/0254581 A1  Oct. 20, 2011

(30) Foreign Application Priority Data

Apr. 19, 2010  (CN) .......................... 2010 1 0150181

(51) Int. Cl.
*G01R 31/28* (2006.01)

(52) U.S. Cl.
USPC ...... 324/763.01; 324/512; 324/527; 324/528; 324/537; 315/136; 361/93.1; 361/93.9; 323/277; 323/282; 323/316; 335/17; 335/18; 335/155; 340/650; 307/131; 363/56.01; 363/80

(58) Field of Classification Search
USPC ............ 324/512, 527, 528, 537, 763, 763.01; 315/136; 361/93.1, 93.9; 363/56.01, 80; 307/131; 340/650; 323/277, 282, 316; 335/17, 335/18, 155
See application file for complete search history.

(56) References Cited

U.S. PATENT DOCUMENTS

| 4,868,678 | A | * | 9/1989 | Kawase et al. | 386/273 |
| 5,914,545 | A | * | 6/1999 | Pollersbeck | 307/131 |
| 7,205,733 | B2 | * | 4/2007 | Xiong et al. | 318/400.11 |
| 7,400,133 | B2 | * | 7/2008 | Hollander et al. | 324/157 |
| 7,439,746 | B2 | * | 10/2008 | Williams | 324/458 |
| 7,598,812 | B2 | * | 10/2009 | Shah et al. | 330/308 |
| 2010/0312080 | A1 | * | 12/2010 | Isaacson | 600/323 |

* cited by examiner

*Primary Examiner* — Jermele M Hollington
*Assistant Examiner* — Sean Curtis
(74) *Attorney, Agent, or Firm* — Altis Law Group, Inc.

(57) ABSTRACT

A short circuit detection device is provided to check a circuit layout. The circuit layout includes electronic components connected in parallel. Any of the electronic components includes two contacts on the circuit layout. The short circuit detection device includes a determination circuit configured to determine whether a short circuit has occurred in the circuit layout, and a detection circuit configured to determine the specific electronic component or components responsible for the short circuit. The determination circuit connects with one contact of any of the electronic components. The detection circuit connects with two contacts of any of the electronic components.

10 Claims, 3 Drawing Sheets

SHORT CIRCUIT DETECTION DEVICE

BACKGROUNDING

1. Technical Field

The present disclosure relates to a short circuit detection device.

2. Description of Related Art

Electronic devices such as mobile phones, computers, or digital still cameras (DSCs), include printed circuit boards (PCBs) integrated with electronic components. The electronic components may include capacitors, resistors, and bipolar junction transistors (BJTs), for example, and are usually connected in parallel. When any one of the electronic components connected in parallel causes a short circuit, a direct current path is formed between two nodes of the PCB. The resistance between the two nodes is, however, very low, making it difficult to measure resistance with a universal electric meter to locate the short circuit.

Therefore, there is room for improvement within the art.

BRIEF DESCRIPTION OF THE DRAWINGS

Many aspects of the present disclosure can be better understood with reference to the following drawings. The components in the various drawings are not necessarily drawn to scale, the emphasis instead being placed upon clearly illustrating the principles of the present disclosure. Moreover, in the drawings, like reference numerals designate corresponding parts throughout the figures.

DETAILED DESCRIPTION

Figure 1:
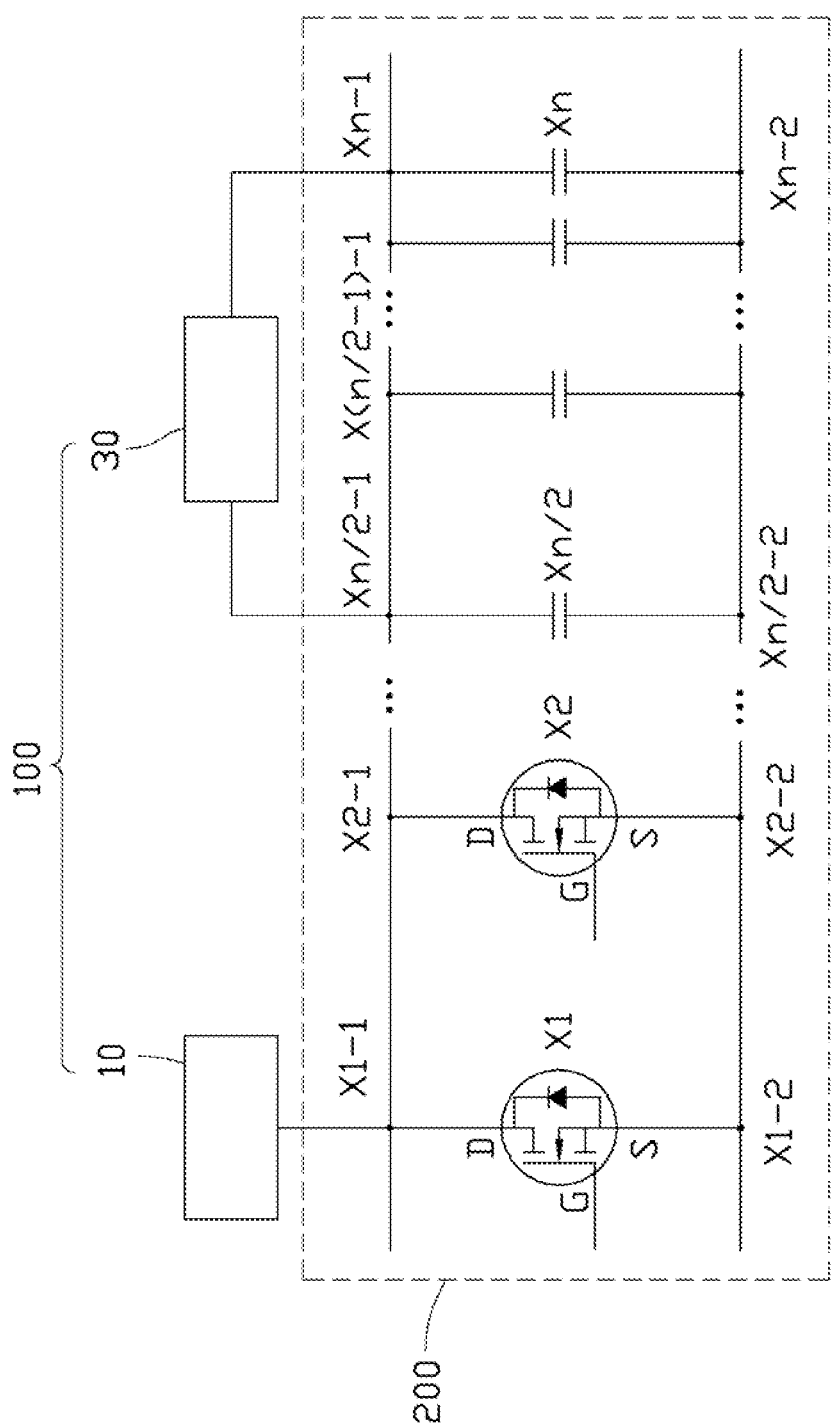
FIG. 1 is a circuit diagram of an exemplary embodiment of a short circuit detection device.

FIG. 1 is a circuit diagram of an exemplary embodiment of a short circuit detection device 100 for use on a circuit layout 200. The short circuit detection device 100 includes a determination circuit 10 and a detection circuit 30.

The circuit layout 200 includes n electronic components X1-Xn (n is an integer greater than one) connected in parallel. In the exemplary embodiment, X1-Xn are called as Xi (i=1, 2 ... n). The electronic components Xi can include a capacitor, a bipolar junction transistor (BJT), and a metal-oxide-semiconductor field-effect transistor (MOSFET), for example, which have high resistance. Any of the electronic components Xi includes two contacts Xi-1 and Xi-2 on the circuit layout 200. Contacts X1-1, X2-1 ... Xn-1 connect together. Contacts X1-2, X2-2 ... Xn-2 connect together and are connected to ground.

Figure 2:
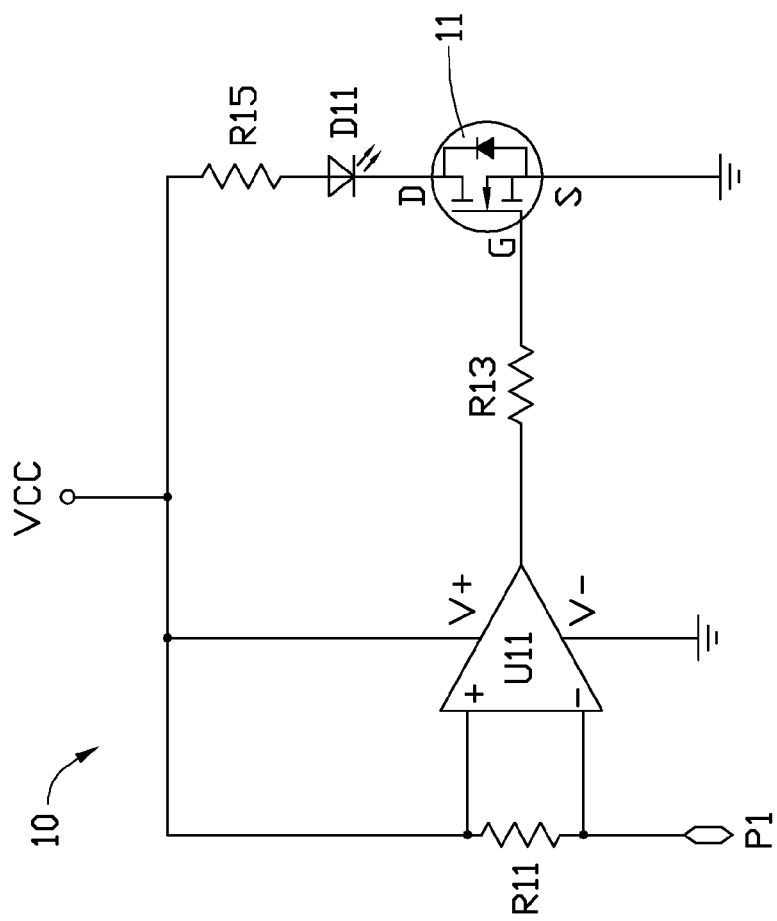
FIG. 2 is a circuit diagram of a determination circuit of FIG. 1.

FIG. 2 is a circuit diagram of the determination circuit 10 of FIG. 1. The determination circuit 10 includes a first operational amplifier U11, a first switch 11, a light-emitting diode (LED) D11, a current limiting resistor R11, two resistors R13, R15, and a test clip P1. The first switch 11 includes a first control end, a first connection end, and a second connection end. When the first control end receives a high electric potential, the first switch 11 is turned on. The first connection end and the second connection end may be conductive with each other. When the first control end receives a low electric potential, the first switch 11 is turned off. The first connection end and the second connection end are not conductive with each other. The first switch 11 may be a BJT or a MOSFET. In the exemplary embodiment, the first switch 11 is a n-channel MOSFET (NMOS). A gate terminal G, a source terminal S, and a drain terminal D of the NMOS are individually the first control end, the first connection end, and the second connection end.

The first operational amplifier U11 includes a first inverting input, a first non-inverting input, and a first output. The first non-inverting input connects with a power supply VCC and the first inverting input connects with the test clip P1. The first inverting input and the first non-inverting input are connected in series through the current limiting resistor R11. The first output connects with the first control end of the first switch 11 through the resistor R13. The first connection end of the first switch 11 is connected to ground. The second connection end of the first switch 11 connects with a negative lead of the LED D11. A positive lead of the LED D11 connects with the power supply VCC through the resistor R15.

The first switch 11 may also be a NPN-type BJT. In the exemplary embodiment, a base, an emitter, and a collector of the NPN-type BJT are individually the first control end, the first connection end, and the second connection end of the first switch 11.

Figure 3:
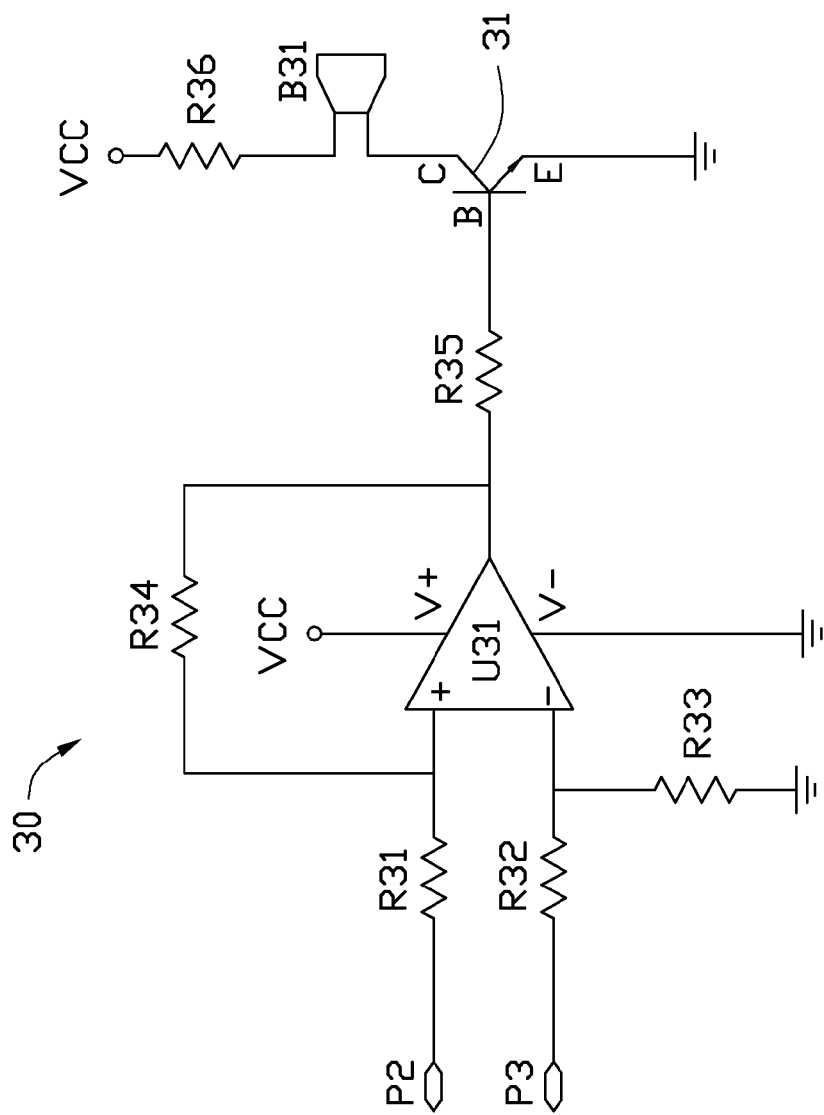
FIG. 3 is a circuit diagram of a detection circuit of FIG. 1.

FIG. 3 is a circuit diagram of the detection circuit 30 of FIG. 1. The detection circuit 30 includes a second operational amplifier U31, a second switch 31, a buzzer B31, resistors R31-R36, and two probes P2, P3. The second switch 31 includes a second control end, a third connection end, and a fourth connection end. When the second control end receives a high electric potential, the second switch 31 is turned on. The third connection end and the fourth connection end may be conductive with each other. When the second control end receives a low electric potential, the second switch 31 is turned off. The third connection end and the fourth connection end cannot be conductive with each other. The second switch 31 may be a BJT or a MOSFET. In the exemplary embodiment, the second switch 31 is a NPN-type BJT. A base B, an emitter E, and a collector C of the NPN-type BJT are individually the second control end, the third connection end, and the fourth connection end.

The second switch 31 may also be a NMOS. In the exemplary embodiment, a gate terminal, a source terminal, and a drain terminal are individually the second control end, the third connection end, and the fourth connection end of the second switch 31.

The second operational amplifier U31 includes a second inverting input, a second non-inverting input, and a second output. The second non-inverting input connects with the probe P2 through the resistor R31. The second inverting input connects with the probe P3 through the resistor R32. The second output connects with the second control end of the second switch 31 through the resistor R35. The third connection end of the second switch 31 is connected to ground. The fourth connection end connects with one end of the buzzer B31. Another end of the buzzer B31 connects with the power supply VCC through the resistor R36.

One end of the resistor R33 connects between the second inverting input and the resistor R32. Another end of the resistor R33 is connected to ground. One end of the resistor R34 connects between the second non-inverting input and the resistor R31. Another end of the resistor R34 connects between the second output and the resistor R35.

If no or minimal electric potential difference is measured between the probes P2 and P3, the second operational amplifier U31 outputs a low electric potential to the second control end. The second switch 31 is turned off, such that no current runs into the buzzer B31, which remains silent. If a large electric potential difference is measured between the probes P2 and P3, the second operational amplifier U31 outputs a high electric potential to the second control end. The second switch 31 is turned on. The third connection end and the fourth connection end of the second switch 31 may be conductive with each other, such that a current reaches the buzzer B31, which is activated accordingly.

The determination circuit 10 is configured to determine whether a short circuit has occurred in the circuit layout 200. The test clip P1 is connected with one of contacts X1-1, X2-1 ... Xn-1 of the circuit layout 200. If the short circuit has occurred in one of the electronic components Xi, a current runs from the power supply VCC to ground with running through the one of the electronic components Xi. The current runs through the current limiting resistor R11, such that an electric potential difference has occurred on the current limiting resistor R11. As a result, the first operational amplifier U11 outputs a high electric potential to the first control end. The first switch 11 is turned on to have the first connection end and the second connection end conductive with each other. The current drives the LED D11 to light. If no short circuit has occurred in the circuit layout 200, no current runs through the current limiting resistor R11. No electric potential difference has occurred on the current limiting resistor R11, such that the first operational amplifier U11 outputs a low electric potential to the first switch 11. The first switch 11 is turned off. The LED D11 cannot light with no current. It can be recognized that a short circuit has occurred in the circuit layout 200 upon that the LED D11 lights.

The detection circuit 30 is configured to locate which of the electronic components Xi has caused a short circuit. The test clip P1 and the probe P3 connect with the contacts X1-1 and Xn-1 of the circuit layout 200. The contact Xn-1 is defined as a reference low electric potential. The probe P2 is took to electronically connects with one selected between the contacts X1-1 and Xn-1. For example, the middle of the contacts X1-1 and Xn-1 is the contact X(n/2)-1, the contact X(n/2)-1 is defined as a reference high electric potential.

If the buzzer B31 is not activated, no electric potential difference has occurred between the contacts X(n/2)-1 and the Xn-1. The current generated from the power supply VCC does not run between the contacts X(n/2)-1 and the Xn-1. It can be recognized that the components Xi causing a short circuit is between contacts X1 and Xn/2 (not including the contact Xn/2). Further detection between the contacts X1 and Xn/2 can identify the electronic component Xi causing the short circuit.

If the buzzer B31 is activated, electric potential difference has occurred between the contacts X(n/2)-1 and Xn-1. The current generated from the power supply VCC runs through one electronic component between the contacts X(n/2)-1 and the Xn-1. The probe P2 connects with the contact X(n/2−1)-1. If the buzzer B31 is not activated, the current generated from the power supply VCC does not run through the contact X(n/2−1)-1. It can be recognized accordingly that electronic component Xn/2 causes the short circuit. If the buzzer B31 is activated, the current generated from the power supply VCC runs through the contact X(n/2−1)-1. It can be recognized accordingly that the electronic components Xi causing the short circuit is between the electronic components X(n/2−1) and Xn. The specific location of the electronic components Xi causing the short circuit can be further determined between the electronic components X(n/2−1) and Xn.

It is to be further understood that even though numerous characteristics and advantages of the present exemplary embodiments have been set forth in the foregoing description, together with details of structures and functions of various exemplary embodiments, the disclosure is illustrative only, and changes may be made in detail, especially in matters of shape, size, and arrangement of parts within the principles of the present invention to the full extent indicated by the broad general meaning of the terms in which the appended claims are expressed.

What is claimed is:

1. A short circuit detection device for use on a circuit layout comprising electronic components connected in parallel, wherein any of the electronic components comprises a first contact and a second contact on the circuit layout, the first contacts of the electronic components connect together, the second contacts of the electronic components are grounded, the device comprising:
   a determination circuit configured to determine whether a short circuit has occurred in the circuit layout; and
   a detection circuit configured to determining the specific electronic component or components responsible for the short circuit;
   wherein the determination circuit comprises a power supply, a first operational amplifier, a first switch, a current limiting resistor, and a test clip; the first operational amplifier comprises a first inverting input, a first non-inverting input, and a first output; the first switch comprises a first control end connecting to the first output, a first connection end, and a second connection end; the current limiting resistor connects between the power supply and the test clip; the first inverting input connects to a node between the current limiting resistor and the test clip, and the first non-inverting input connects between a node between the current limiting resistor and the power supply; the test clip further connects with the first contact of any of the electronic components; and
   wherein the detection circuit connects with the first contacts of any two of the electronic components.

2. The device of claim 1, wherein the determination circuit further comprises a light-emitting diode (LED), the first connection end is connected to ground and the second connection end connects with a negative lead of the LED.

3. The device of claim 2, wherein a positive lead of the LED connects with the power supply.

4. The device of claim 1, wherein the first switch is a n-channel MOSFET (NMOS).

5. The device of claim 1, wherein the first switch is a NPN-type bipolar junction transistor (BJT).

6. The device of claim 1, wherein the detection circuit comprises:
   a second operational amplifier comprising a second inverting input, a second non-inverting input, and a second output;
   a second switch comprising a second control end, a third connection end, and a fourth connection end;
   a buzzer; and
   two probes;
   wherein the second non-inverting input and the second inverting input connect with the two probes respectively;
   wherein the second output connects with the second control end.

7. The device of claim 6, wherein the third connection end is electronically connected to ground and the fourth connection end connects with one end of the buzzer.

8. The device of claim 7, wherein other end of the buzzer connects with the power supply.

9. The device of claim 3, wherein when a short circuit has occurred in the circuit layout, a current flows through the current limiting resistor, such that an electric potential difference has occurred on the current limiting resistor, the first operational amplifier outputs a high electric potential to switch on the first switch, and the LED is powered on.

10. The device of claim 6, wherein one of the probes connects to one of the electronic components, the other one of the probes connects to another one of the electronic components.

* * * * *